United States Patent
Tanikawa et al.

(10) Patent No.: US 9,892,951 B2
(45) Date of Patent: Feb. 13, 2018

(54) METHOD OF CONTROLLING ADHERENCE OF MICROPARTICLES TO SUBSTRATE TO BE PROCESSED, AND PROCESSING APPARATUS

(71) Applicant: TOKYO ELECTRON LIMITED, Tokyo (JP)

(72) Inventors: Takehiro Tanikawa, Miyagi (JP); Kazuki Moyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 121 days.

(21) Appl. No.: 14/387,654

(22) PCT Filed: Nov. 7, 2012

(86) PCT No.: PCT/JP2012/078875
§ 371 (c)(1),
(2) Date: Sep. 24, 2014

(87) PCT Pub. No.: WO2013/161106
PCT Pub. Date: Oct. 31, 2013

(65) Prior Publication Data
US 2015/0075566 A1    Mar. 19, 2015

(30) Foreign Application Priority Data
Apr. 25, 2012   (JP) ................................ 2012-100213

(51) Int. Cl.
*B08B 9/00*     (2006.01)
*H01L 21/683*   (2006.01)
(Continued)

(52) U.S. Cl.
CPC ...... *H01L 21/6831* (2013.01); *C23C 16/4401* (2013.01); *H01J 37/32192* (2013.01);
(Continued)

(58) Field of Classification Search
CPC .. B08B 6/00; B08B 9/00; B08B 9/027; H01L 21/32137; H01L 21/6831; C23C 16/4401;
(Continued)

(56) References Cited

U.S. PATENT DOCUMENTS 5,507,874 A * 4/1996 Su ........................ B08B 7/0035
                                                          118/723 R
5,531,862 A * 7/1996 Otsubo .................. C23C 14/564
                                                             134/1.2
(Continued)

FOREIGN PATENT DOCUMENTS

JP    9-120988 A     5/1997
JP    2003-332304 A  11/2003
(Continued)

OTHER PUBLICATIONS

International Search Report dated Feb. 5, 2013 in PCT/JP2012/078875.

*Primary Examiner* — Sharidan Carrillo
(74) *Attorney, Agent, or Firm* — Rothwell, Figg, Ernst & Manbeck, P.C.

(57) ABSTRACT

A method of controlling adherence of microparticles to a substrate to be processed includes applying voltage to an electrostatic chuck configured to electrostatically attract the substrate to be processed in a processing container before the substrate to be processed is carried into the processing container; and, after the applying of voltage to the electrostatic chuck, carrying the substrate to be processed into the processing container. Further, in the applying of voltage to the electrostatic chuck, the voltage is applied to the electrostatic chuck to reduce a potential difference between a focus ring and the substrate to be processed, the focus ring being provided to surround the electrostatic chuck.

8 Claims, 8 Drawing Sheets

(51) Int. Cl.
*H01J 37/32* (2006.01)
*C23C 16/44* (2006.01)
*H01L 21/3213* (2006.01)

(52) U.S. Cl.
CPC .. *H01J 37/32642* (2013.01); *H01J 37/32715* (2013.01); *H01J 37/32862* (2013.01); *H01L 21/32137* (2013.01); *Y10T 29/49998* (2015.01)

(58) Field of Classification Search
CPC ........... H01J 37/32192; H01J 37/32642; H01J 37/32715; H01J 37/32862
See application file for complete search history.

(56) References Cited

U.S. PATENT DOCUMENTS

| | | | | |
|---|---|---|---|---|
| 5,746,928 A | * | 5/1998 | Yen | ................... H01L 21/6833 134/1.1 |
| 5,942,039 A | * | 8/1999 | Kholodenko | ..... H01J 37/32642 118/723 E |
| 5,997,962 A | * | 12/1999 | Ogasawara | .............. B05D 3/06 216/67 |
| 6,370,005 B1 | * | 4/2002 | Sun | ..................... H01L 21/6833 361/234 |
| 2004/0177927 A1 | * | 9/2004 | Kikuchi | ............ H01J 37/32174 156/345.51 |
| 2005/0039773 A1 | * | 2/2005 | Moriya | ............... C23C 16/4401 134/1.2 |
| 2005/0230049 A1 | * | 10/2005 | Nishio | .............. H01J 37/32082 156/345.51 |
| 2005/0272227 A1 | | 12/2005 | Moriya et al. | |
| 2011/0108056 A1 | * | 5/2011 | Ishizawa | ................... B08B 6/00 134/1 |

FOREIGN PATENT DOCUMENTS

| | | |
|---|---|---|
| JP | 2005-101539 A | 4/2005 |
| JP | 2009-212333 A | 9/2009 |
| JP | 2012-204644 A | 10/2012 |
| TW | I234417 B | 6/2005 |

* cited by examiner

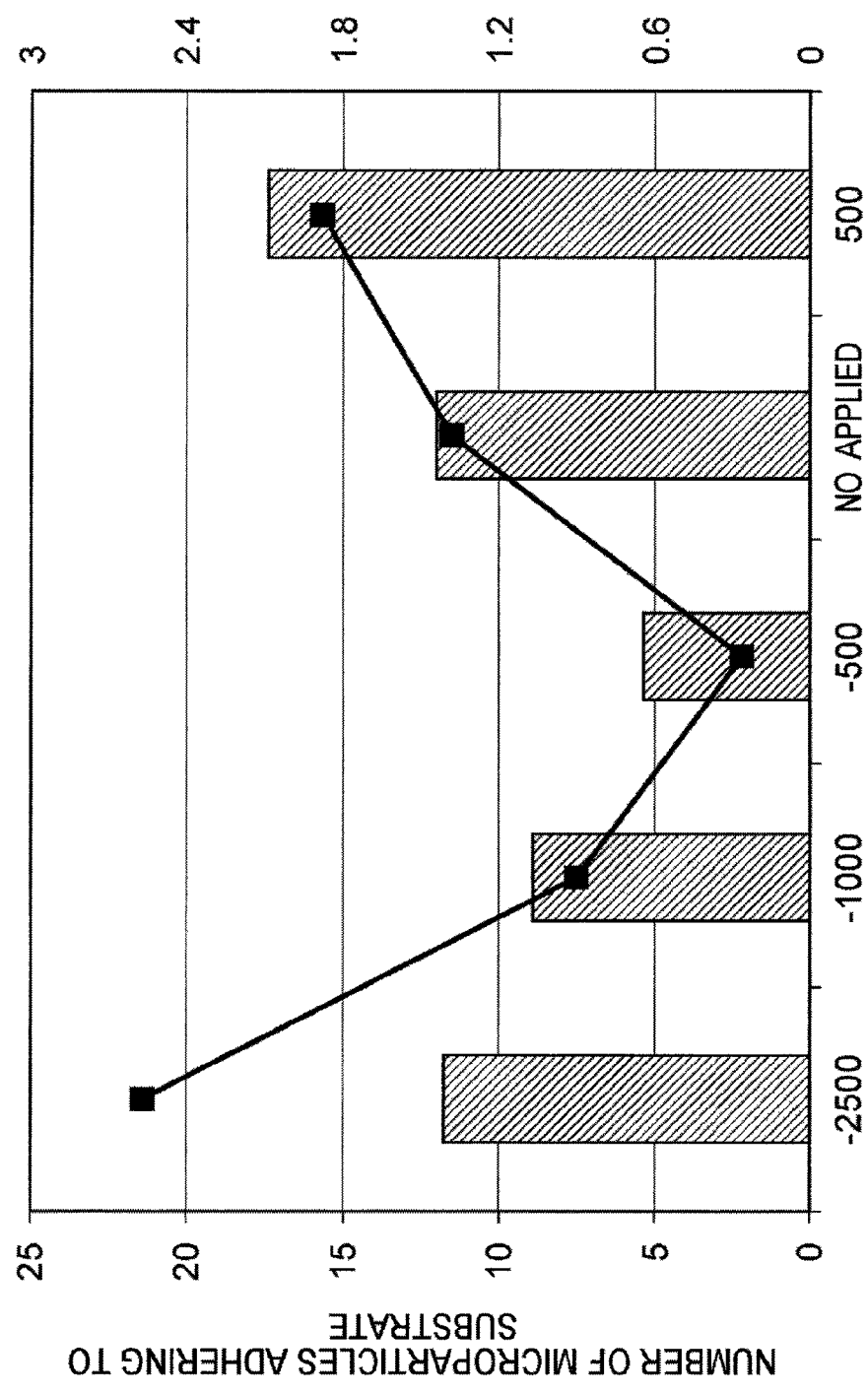

METHOD OF CONTROLLING ADHERENCE OF MICROPARTICLES TO SUBSTRATE TO BE PROCESSED, AND PROCESSING APPARATUS

CROSS REFERENCE TO RELATED APPLICATION

This application is a 35 U.S.C. 371 National Phase Entry Application from PCT/JP2012/078875, filed Nov. 7, 2012, which claims priority to Japanese Patent Application No. 2012-100213, filed Apr. 25, 2012, the disclosures of which are incorporated herein in their entirety by reference.

TECHNICAL FIELD

The present disclosure relates to a method of controlling adherence of microparticles to a substrate to be processed, and a processing apparatus of the substrate to be processed.

BACKGROUND

In a semiconductor manufacturing process, a process such as, for example, etching of a substrate to be processed or a film forming on the substrate to be processed is performed in a processing apparatus. For example, the processing such as etching or film forming with respect to the substrate to be processed is performed by generating the plasma of processing gas in the processing apparatus.

After the processing is performed on the substrate to be processed, microparticles are generated in the processing container. The microparticles are generated by, for example, the reaction of the plasma of the processing gas with an electrostatic chuck or a member in the processing container such as an inner wall of the processing container.

The microparticles generated in the processing container adversely affect the processing of the substrate to be processed or performance of semiconductor devices to be manufactured. Accordingly, cleaning has been conventionally performed to remove microparticles in the processing container before the substrate to be processed is carried into the processing container. For example, Patent Document 1 discloses a technique of removing microparticles by applying voltage to a member in a processing container to scatter the microparticles adhering to the member.

PRIOR ART DOCUMENT

Patent Document

Patent Document 1: Japanese Patent Laid-Open Publication No. 2005-101539

DISCLOSURE OF THE INVENTION

Problems to be Solved

In order to conduct a uniform processing on a substrate to be processed, a processing apparatus for the substrate to be processed may be provided with a focus ring configured to surround an electrostatic chuck. The present inventors have found out that, when cleaning is performed prior to a processing of the substrate to be processed, and then, the substrate to be processed is transferred to the processing container, microparticles may be adhering to the substrate to be processed in the processing apparatus.

Accordingly, it has been necessary to reduce the adherence of microparticles to a substrate to be processed in the present art.

Means to Solve the Problems

A method of controlling adherence of microparticles according to an aspect of the present disclosure includes applying voltage to an electrostatic chuck configured to electrostatically attract the substrate to be processed in a processing container before the substrate to be processed is carried into the processing container; and after the applying of voltage to the electrostatic chuck, carrying the substrate to be processed into the processing container. Further, in the applying of voltage to the electrostatic chuck, the voltage is applied to the electrostatic chuck to reduce a potential difference between a focus ring and the substrate to be processed, the focus ring being provided to surround the electrostatic chuck.

The present inventors have found out that microparticles may be adhering to the substrate to be processed because the microparticles are moved from the focus ring to the substrate to be processed by a potential difference between the focus ring and the substrate to be processed as a cause of the adherence of the microparticles to the substrate to be processed. Therefore, in the method of controlling the adherence of microparticles according to an aspect of the present disclosure, the potential difference between the focus ring and the substrate to be processed is reduced by applying voltage to the electrostatic chuck. As a result, when the substrate to be processed is carried into the processing container after the applying of voltage to the electrostatic chuck, the adherence of the microparticles to the substrate to be processed due to the movement of the microparticles adhering to the focus ring towards the substrate to be processed by the potential difference between the focus ring and the substrate to be processed, is reduced.

The method of controlling the adherence of microparticles according to an exemplary embodiment may further include, before the applying of voltage to the electrostatic chuck, cleaning an inside of the processing container in a state where the substrate to be processed is not accommodated in the processing container. Accordingly, the adherence of the microparticles remaining after the cleaning to the substrate to be processed may be reduced.

In the control method according to an exemplary embodiment, the applying of voltage to the electrostatic chuck may be performed every time before the carrying-in of the substrate to be processed. Accordingly, when the applying of voltage to the electrostatic chuck is performed before a new substrate to be processed is carried into the processing container, the adherence of the microparticles to the substrate to be processed may be more ensured to be reduced.

In the control method according to an exemplary embodiment, in the applying of voltage to the electrostatic chuck, a negative voltage having an absolute value less than an absolute value of the voltage when the electrostatic chuck electrostatically attracts the substrate to be processed is applied to the electrostatic chuck. The microparticles in the processing container are usually positively charged. Therefore, when a negative voltage is applied and the absolute value of the voltage is set to a value less than the absolute value of the voltage applied to the electrostatic chuck when the electrostatic attraction is performed, the adherence of the microparticles to the substrate to be processed may be further reduced.

A processing apparatus according to another aspect of the present disclosure includes an electrostatic chuck provided in a processing container; a direct current (DC) power supply configured to apply DC voltage to the electrostatic chuck; and a control unit configured to control the DC power supply. The control unit controls the DC power supply such that the voltage is applied to the electrostatic chuck to reduce a potential difference between a focus ring and a substrate to be processed before the substrate to be processed is transferred to the processing container, the focus ring being provided to surround the electrostatic chuck.

Accordingly, when the substrate to be processed is carried into the processing container after the applying of voltage to the electrostatic chuck, the adherence of the microparticles to the substrate to be processed due to the movement of the microparticles adhering to the focus ring towards the substrate to be processed by the potential difference between the focus ring and the substrate to be processed, is reduced.

The processing apparatus according to an exemplary embodiment may further include a gas supply unit configured to supply a cleaning gas to the processing container. The control unit supplies the cleaning gas to the gas supply unit before the substrate to be processed is carried into the processing container and also before the voltage is applied by the DC power supply. Accordingly, reaction by-products in the processing container may be removed by the cleaning gas excited by plasma.

In the processing apparatus according to an exemplary embodiment, the control unit controls the DC power supply such that voltage is applied to the electrostatic chuck to reduce a potential difference between a focus ring and the substrate to be processed every time before the substrate to be processed is carried in. Accordingly, when the applying of voltage to the electrostatic chuck is performed before a new substrate to be processed is carried into the processing container, the adherence of microparticles to the substrate to be processed may be more ensured to be reduced.

In the processing apparatus according to an exemplary embodiment, the voltage that reduces a potential difference between the focus ring and the substrate to be processed is a negative voltage having an absolute value less than an absolute value of the voltage when the electrostatic chuck electrostatically attracts the substrate to be processed. Therefore, when a negative voltage is applied and the absolute value of the voltage is set to a value less than the absolute value of the voltage applied to the electrostatic chuck when the electrostatic attraction is performed, the adherence of microparticles to the substrate to be processed may be further reduced.

Effect of the Invention

As described above, according to various aspects and exemplary embodiments of the present disclosure, the adherence of microparticles to a substrate to be processed may be reduced.

BRIEF DESCRIPTION OF THE DRAWINGS

FIG. 8 is a view illustrating the number of microparticles adhering to the substrate to be processed in a case of changing the voltage applied to the electrostatic chuck, and the deviation of the distribution of the microparticles on the substrate to be processed.

DETAILED DESCRIPTION TO EXECUTE THE INVENTION

Figure 1:
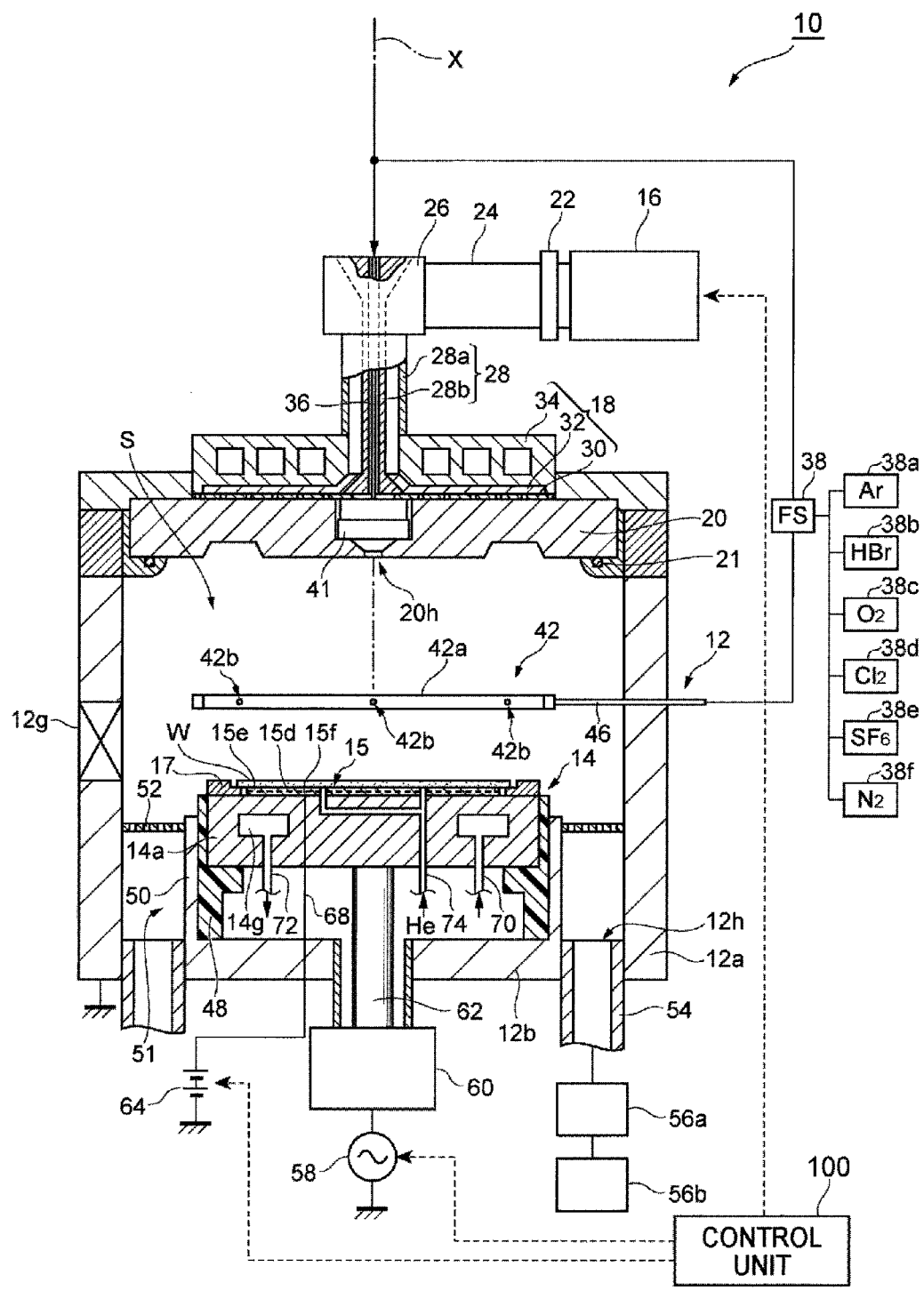
FIG. 1 is a schematic cross-sectional view illustrating a plasma processing apparatus according to an exemplary embodiment.

Hereinafter, various exemplary embodiments of a plasma processing apparatus which employs a method of controlling adherence of microparticles will be described in detail with reference to drawings. Meanwhile, in each drawing, the same reference numerals will be given to the same or corresponding parts.

FIG. 1 is a schematic view illustrating a plasma processing apparatus according to an exemplary embodiment. The plasma processing apparatus 10 as illustrated in FIG. 1 includes a processing container 12, a stage 14, a microwave generator 16, antenna 18, and a dielectric window 20. The plasma processing apparatus 10 is a microwave plasma processing apparatus which generates plasma by a microwave from the antenna 18. Meanwhile, the plasma processing apparatus may be any plasma processing apparatus other than the microwave plasma processing apparatus. The plasma processing apparatus may be, for example, a parallel flat plate electrode type plasma processing apparatus, an etching apparatus using plasma, or a CVD apparatus using plasma.

The processing container 12 defines a processing space S to perform a plasma processing on a substrate to be processed W. The processing container 12 may include a sidewall 12a and a bottom 12b. The sidewall 12a has a substantially cylindrical shape that extends in an axis X direction (i.e., an extension direction of the axis X). The bottom 12b is formed at a lower end of the sidewall 12a. The bottom 12b is formed with an exhaust hole 12h for exhaust. An upper end portion of the sidewall 12a is opened.

The upper end opening of the sidewall 12a is blocked by the dielectric window 20. An O-ring 21 may be interposed between the dielectric window 20 and the upper end portion of the sidewall 12a. The O-ring 21 ensures sealing of the processing container 12. The sidewall 12a is formed with a gate 12g for carrying-in/out of the substrate to be processed W.

The microwave generator 16 generates a microwave of, for example, 2.45 GHz. In the exemplary embodiment, the plasma processing apparatus 10 further includes a tuner 22, a waveguide tube 24, a mode converter 26, and a coaxial waveguide tube 28. Meanwhile, the microwave generator 16, the tuner 22, the waveguide tube 24, the mode converter 26, the coaxial waveguide tube 28, the antenna 18, and the dielectric window 20 constitute an introduction unit configured to introduce energy for generating plasma to the processing space S.

The microwave generator 16 is connected to the waveguide tube 24 through the tuner 22. The waveguide tube 24 is, for example, a rectangular waveguide tube. The waveguide tube 24 is connected to the mode converter 26, and the mode converter 26 is connected to an upper end of the coaxial waveguide tube 28.

The coaxial waveguide tube 28 extends along the axis X. The coaxial waveguide tube 28 includes an outer conductor 28a and an inner conductor 28b. The outer conductor 28a has a substantially cylindrical shape that extends in the axis X direction. The inner conductor 28b is provided inside the outer conductor 28a. The inner conductor 28b has a substantially cylindrical shape that extends in the axis X direction.

The microwave generated by the microwave generator 16 is guided to the mode converter 26 through the tuner 22 and the waveguide tube 24. The mode converter 26 converts a mode of the microwave, and then, supplies the mode-converted microwave to the coaxial waveguide tube 28. The microwave from the coaxial waveguide tube 28 is supplied to the antenna 18.

The antenna 18 radiates a microwave for plasma excitation based on the microwave generated by the microwave generator 16. The antenna 18 may include a slot plate 30, a dielectric plate 32, and a cooling jacket 34.

Figure 2:
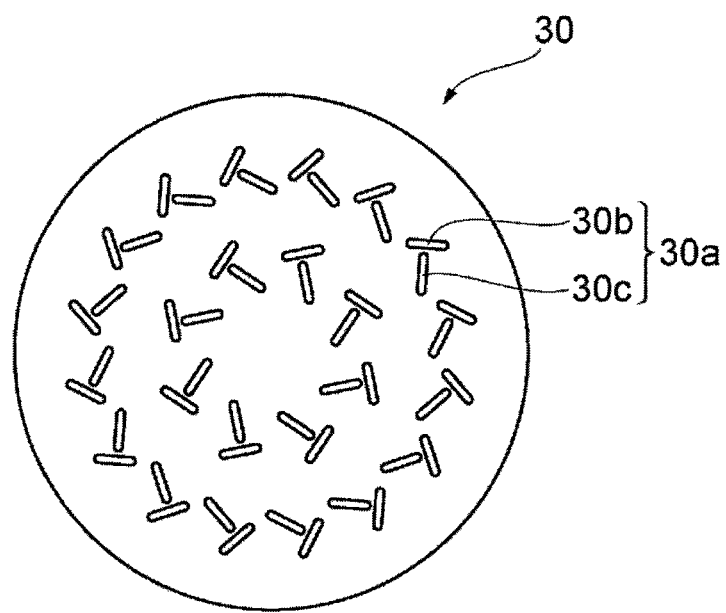
FIG. 2 is a plan view illustrating a slot plate according to an exemplary embodiment when viewed in an axis X direction.

A plurality of slots is arranged on the slot plate 30 circumferentially around the axis X. FIG. 2 is a plan view illustrating a slot plate according to an exemplary embodiment when viewed in the axis X direction. In the exemplary embodiment, as illustrated in FIG. 2, the slot plate 30 may be a slot plate constituting a radial line slot antenna. The slot plate 30 is constituted as a conductive disc made of metal. The slot plate 30 is formed with a plurality of slot pairs 30a. Each slot pair 30a includes a slot 30b and a slot 30c which extend in a direction intersecting with or orthogonal to each other. The plurality of slot pairs 30a is disposed radially at a predetermined interval, as well as circumferentially at a predetermined interval.

The dielectric plate 32 is provided between the slot plate 30 and a lower surface of the cooling jacket 34. The dielectric plate 32 is made of, for example, quartz, and has a substantially disc shape. The surface of the cooling jacket 34 may be conductive. The cooling jacket 34 cools the dielectric plate 32 and the slot plate 30. Therefore, a flow path for a coolant is formed in the cooling jacket 34. An upper surface of the cooling jacket 34 is electrically connected with a lower end of the outer conductor 28a. Further, a lower end of the inner conductor 28b is electrically connected to the slot plate 30 through a hole formed in a central portion of the cooling jacket 34 and the dielectric plate 32.

The microwave from the coaxial waveguide tube 28 is propagated to the dielectric plate 32, and introduced into the processing space S from the slots of the slot plate 30 through the dielectric window 20. The dielectric window 20 has a substantially disc shape and is made of, for example, quartz. The dielectric window 20 is provided between the processing space S and the antenna 18. In an exemplary embodiment, the dielectric window 20 is provided just below the antenna 18 in the axis X direction.

In an exemplary embodiment, a conduit 36 passes through an inner hole of the inner conductor 28b of the coaxial waveguide tube 28. The conduit 36 extends along the axis X and may be connected to a flow splitter 38.

In an exemplary embodiment, the plasma processing apparatus 10 may further include an injector 41. The injector 41 supplies a gas from the conduit 36 to a through hole 20h formed on the dielectric window 20. The gas supplied to the through hole 20h of the dielectric window 20 is supplied to the processing space S.

In an exemplary embodiment, the plasma processing apparatus 10 may further include a gas supply unit 42. The gas supply unit 42 supplies a gas from a periphery of the axis X to the processing space S between the stage 14 and the dielectric window 20. The gas supply unit 42 may include a conduit 42a. The conduit 42a extends annularly around the axis X between the dielectric window 20 and the stage 14. The conduit 42a is formed with a plurality of gas supply holes 42b. The plurality of gas supply holes 42b is arranged annularly and opened towards the axis X so as to supply the gas supplied to the conduit 42a towards the axis X. The gas supply unit 42 is connected to the flow splitter 38 through a conduit 46.

The flow splitter 38 is connected to the conduit 36 and the gas supply unit 42. Further, the flow splitter 38 is connected with a gas source 38a for Ar gas, a gas source 38b for HBr gas, a gas source 38c for $O_2$ gas, a gas source 38d for $Cl_2$ gas, a gas source 38e for $SF_6$ gas, and a gas source 38f for $N_2$ gas. These gas sources 38a to 38f are capable of controlling the supply of the gases, stop supplying of the gases, and flow rates of the gases. The flow splitter 38 controls the flow ratio of the gases branching from the gas sources 38a to 38f to the conduit 36 and the gas supply units 42.

Meanwhile, the $SF_6$ gas and the $O_2$ gas are used in a cleaning processing to remove the reaction by-products in the processing space S. The Ar gas, the HBr gas, the $O_2$ gas, and the $Cl_2$ gas are used in a plasma processing of the substrate to be processed W (e.g., etching of polysilicon). The $N_2$ gas is used as a purge gas to replace the gas in the processing container 12. The gas species mentioned herein is illustrative, and other kinds of gases may be used. Further, depending on the kind of plasma processing, a processing may be performed on the substrate to be processed W by providing one or more gas sources different from the aforementioned gas sources and combining the gases. Meanwhile, the gas sources 38c and 38e constitute the gas supply unit configured to supply the cleaning gas to the processing container 12.

The stage 14 is provided to face the dielectric window 20 in the axis X direction. The stage 14 is provided such that the processing space S is sandwiched between the dielectric window 20 and the stage 14. The substrate to be processed W is placed on the stage 14. In an exemplary embodiment, the stage 14 may include a table 14a, an electrostatic chuck 15, and a focus ring 17.

The table 14a is supported by a cylindrical support 48. The cylindrical support 48 is made of an insulating material, and extends vertically upwardly from the bottom 12b. Further, a conductive cylindrical support 50 is provided in an outer periphery of the cylindrical support 48. The cylindrical support 50 extends along the outer periphery of the cylindrical support 48 vertically upwardly from the bottom 12b of the processing container 12. An annular exhaust path 51 is formed between the cylindrical support 50 and the sidewall 12a.

An annular plate 52 formed with a plurality of through holes is attached above the exhaust path 51. The exhaust hole 12h is connected with an exhaust pipe 54. Further, the exhaust pipe 54 is connected with an exhaust device 56b through a pressure regulator 56a. The exhaust device 56b is provided with a vacuum pump such as a turbo molecular pump. The pressure regulator 56a adjusts an exhaust amount of the exhaust device 56b to adjust pressure in the processing container 12. By the exhaust device 56b, the processing space S in the processing container 12 may be decompressed to a desired vacuum degree.

The table 14a also serves as a high-frequency electrode. The table 14a is electrically connected with a high-frequency power supply 58 for RF bias through a matching unit 60 and a power feeding rod 62. The high-frequency power supply 58 outputs a high-frequency power having a constant frequency suitable for controlling the energy of ions drawn into the substrate to be processed W, for example, 13.65 MHz at a predetermined power. The matching unit 60 accommodates a matcher configured to match the impedance of the high-frequency power supply 58 and the impedance of the loads such as an electrode, plasma, and the processing container 12. A blocking capacitor for self-bias generation is included in the matcher.

On the top surface of the table 14a, the electric chuck 15 serving as a holding member is provided to hold the substrate to be processed W. The electric chuck 15 holds the substrate to be processed W by an electrostatic attraction force. The focus ring 17 is provided radially outside the electrostatic chuck 15 to annularly surround the periphery of the substrate to be processed W and the periphery of the electrostatic chuck 15. The focus ring 17 is mounted on the table 14a to surround a side end surface of the electrostatic chuck 15. The focus ring 17 is made of, for example, silicon oxide ($SiO_2$), and is an annular plate.

The electrostatic chuck 15 has a substantially disc shape. The electrostatic chuck 15 includes an electrode 15d and insulating films 15e and 15f made of, for example, aluminum oxide ($Al_2O_3$). The electrode 15d is constituted with a conductive film, and provided between the insulating film 15e and the insulating film 15f. The electrode 15d is electrically connected with a high voltage DC power supply 64 through a coated wire 68. The electrostatic chuck 15 is able to hold the substrate to be processed W by a Coulomb force generated by the DC voltage applied from the DC power supply 64.

An annular coolant chamber 14g extending circumferentially is formed inside the table 14a. A coolant such as, for example, cooling water at a predetermined temperature is circulated and supplied to the coolant chamber 14g from a chiller unit (not illustrated) through pipes 70 and 72. A heat transfer gas of the electrostatic chuck 15 such as, for example, He gas is supplied to a space between the top surface of the electrostatic chuck 15 and a rear surface of the substrate to be processed W through a gas supply pipe 74 by the temperature of the coolant.

In an exemplary embodiment, the plasma processing apparatus 10 may be provided with a control unit 100 configured to control the respective parts. Specifically, the control unit 100 performs the supply of the gases by the gas sources 38a to 38f and the stop of the supply, the control of flow rates of the gases, the control of generation of the microwave by the microwave generator 16, the control of the high-frequency power supply 58 for RF bias, the control of the DC power supply 64 to apply voltage to the electrostatic chuck 15, the decompression control of the processing container 12 by the pressure regulator 56a and the exhaust device 56b, and the control of carrying-in and carrying-out of the substrate to be processed W.

In the plasma processing apparatus 10 as configured above, gas is supplied to the processing space S along the axis X from the through hole 20h of the dielectric window 20 through the conduit 36 and a through hole 41h of the injector 41. Further, below the through hole 20h, gas is supplied from the gas supply unit 42 towards the axis X. Further, microwave is introduced into the processing space S and/or the through hole 20h from the antenna 18 through the dielectric window 20. Accordingly, plasma is generated in the processing space S and/or the through hole 20h. Therefore, according to the plasma processing apparatus 10, plasma may be generated without applying a magnetic field. In the plasma processing apparatus 10, the substrate to be processed W placed on the stage 14 may be processed by the plasma of the processing gas.

Figure 3:
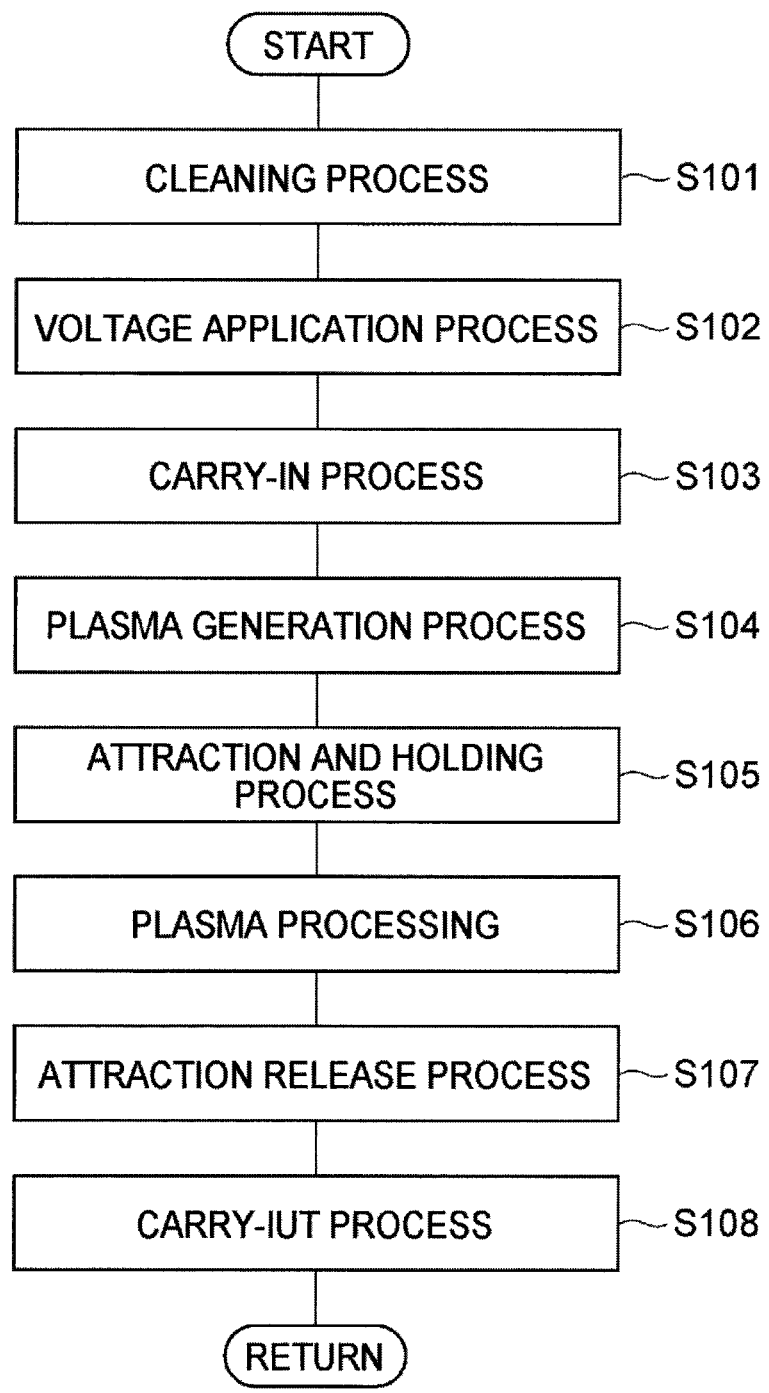
FIG. 3 is a flowchart illustrating control processes performed by a control unit according to an exemplary embodiment.
Figure 4:
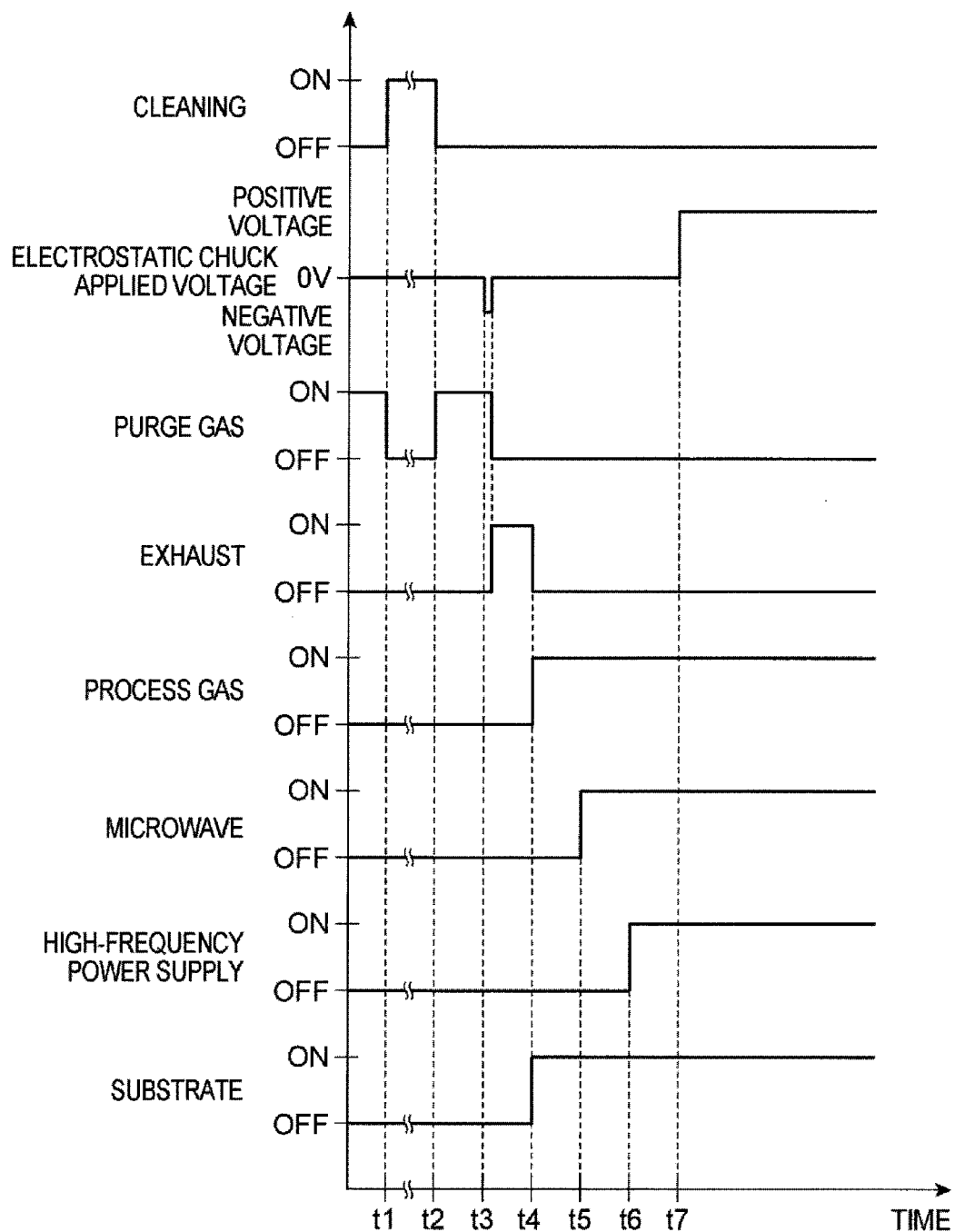
FIG. 4 is a view illustrating a state of each part before and after carrying-in of a substrate to be processed to a processing container.

Hereinafter, referring to FIGS. 3 and 4, the control performed by the control unit 100 will be described in detail. FIG. 3 is a view illustrating the control processes performed by the control unit 100. FIG. 4 is a view illustrating the state of each part from a time before carrying-in the substrate to be processed W to the processing container 12 to a time immediately after the carrying-in thereof. Meanwhile, in FIG. 4, a state where a cleaning process is being performed is denoted as "ON", and a state where the cleaning process is not performed is denoted as "OFF". Further, in FIG. 4, a state where the substrate to be processed W is not carried into the processing container 12 is denoted as "OFF", and a state where the substrate to be processed W is carried into the processing container 12 is denoted as "ON".

As illustrated in FIGS. 3 and 4, the control unit 100 controls the gas source 38f to stop the supply of the $N_2$ gas which has been supplied to the processing container 12 after the completion of a previous processing of the substrate to be processed W (time t1). Then, the control unit 100 performs a cleaning process (step S101) to remove the reaction by-products in the processing container 12 before the substrate to be processed W is carried into the processing container 12 (time t1 to t2). In the cleaning process, as an example of removal of the reaction by-products, wafer less dry cleaning (WLDC) is performed. In the WLDC, a mixed gas of $SF_6$ and $O_2$, for example, is used as the processing gas. $SF_6$ and $O_2$ are supplied to the processing container 12 when the control unit 100 controls the gas sources 38e and 38c. In the WLDC, a removal of the reaction by-products or neutralization is performed by generating plasma of the processing gas in the processing container 12. Meanwhile, in the neutralization by the WLDC, each part in the processing container is not fully neutralized, but each part is charged. Therefore, even after the WLDC, a potential difference may be generated between the focus ring 17 and the electrostatic chuck 15. Detailed descriptions will be made later on a structure in which each part in the processing container 12 is charged after the WLDC. After the cleaning process, the control unit 100 controls the gas source 38f to start the supply of the $N_2$ gas to the processing container 12 (time t2).

Next, the control unit 100 performs a voltage application process (step S102) to apply voltage to the electrostatic chuck 15 by controlling the DC power supply 64 before the substrate to be processed W is carried in (time t3). In the voltage application process, voltage is applied to the electrostatic chuck 15 so as to reduce the potential difference between the focus ring 17 and a substrate to be processed W to be carried into the processing container 12 in a subsequent process. Further, the voltage application process is performed every time before the substrate to be processed W is carried into the processing container 12. Meanwhile, when the voltage application process is performed, the pressure regulator 56a may control the pressure in the processing space S to, for example, 200 mTorr (26.7 Pa) based on the pressure in the processing space S as measured by a process sensor.

Here, it is considered that the focus ring 17 is positively charged before the carrying-in of the substrate to be processed W. This phenomenon may be generated, for example, because a positive ion remaining when the plasma generated in the prior cleaning (WLDC processing) process is extinguished is attached to a member in the processing container 12. Further, in a case where the cleaning process is not performed, the phenomenon may be generated because a positive ion remaining when the plasma generated in the prior processing such as etching is extinguished is attached to a member in the processing container 12. Further, the substrate to be processed W carried into the processing container 12 may be charged during the transfer. Therefore, the control unit 100 controls a voltage value of the voltage applied to the electrostatic chuck 15 and controls the applying time of the voltage so as to reduce the potential difference between the focus ring 17 and the substrate to be processed W which are charged.

Hereinafter, in order to reduce the potential difference between the focus ring 17 and the substrate to be processed W which are charged, an example of the voltage value of the voltage applied to the electrostatic chuck 15 and the applying time of the voltage will be shown. For example, in a case where a charging voltage of the focus ring is positive several hundred volts and a charging voltage of the substrate to be processed W is positive several volts, the control unit 100 controls the DC power supply 64 such that a voltage of negative several hundred volts is applied to the electrostatic chuck 15 for one second. The potential difference between the focus ring 17 and the substrate to be processed W may be reduced by performing the voltage application process. Further, the voltage applied to the electrostatic chuck 15 may be set to a negative voltage having an absolute value less than an absolute value of the voltage applied to the electrostatic chuck 15 when the electrostatic attraction is performed. Here, as an example, it is assumed that negative voltage is applied to the electrostatic chuck 15 in the voltage application process. However, in a case where the focus ring 17 is negatively charged, the potential difference between the focus ring 17 and the substrate to be processed W may be reduced by applying positive voltage to the electrostatic chuck 15.

When the application of voltage to the electrostatic chuck 15 is completed, the control unit 100 controls the gas source 38f to stop the supply of the $N_2$ gas to the processing container 12 and performs an exhaust of the atmosphere in the processing container 12.

Next, the control unit 100 stops the exhaust of the atmosphere in the processing container 12 and performs a carry-in process (step S103) to carry the substrate to be processed W into the processing container 12 (time t4). Specifically, the control unit 100 controls an arm, which performs the carry-in of the substrate to be processed W, to carry the substrate to be processed W onto the electrostatic chuck 15 in the processing container 12 through a gate 12g.

After the substrate to be processed W is carried into the processing container 12, the control unit 100 controls the gas sources 38a to 38d to start the supply of the Ar gas, the HBr gas, the $O_2$ gas, and the $Cl_2$ gas to the processing container 12. Then, the control unit 100 operates the microwave generator 16 (time t5) to perform a plasma generation process (step S104) in order to generate plasma in the processing container 12.

Then, the control unit 100 operates the high-frequency power supply 58 (time t6) to draw ions to the substrate to be processed W, and controls the DC power supply 64 to perform an attraction and holding process (step S105) in order to attract and hold the substrate to be processed W by the electrostatic chuck 15 (time t7). Here, the control unit 100 controls the DC power supply 64 such that positive DC voltage is applied to the electrostatic chuck 15. Meanwhile, the substrate to be processed W may be attracted to and held by the electrostatic chuck 15 simultaneously with operating the microwave generator 16 to generate plasma. By the aforementioned process, a plasma processing (e.g., etching) using plasma is performed on the substrate to be processed W (step S106).

When the plasma processing on the substrate to be processed W is completed, the control unit 100 controls the gas sources 38a to 38d to stop the supply of the Ar gas, the HBr gas, the $O_2$ gas, and the $Cl_2$ gas to the processing container 12, and controls the gas source 38f to start the supply of the $N_2$ gas to the processing container 12. Further, the control unit 100 stops the generation of the microwave by the microwave generator 16 and stops the output of the high-frequency voltage by the high-frequency power supply 58. Further, the control unit 100 controls the DC power supply 64 to stop the application of the voltage to the electrostatic chuck 15, and releases the attraction and holding of the substrate to be processed W by the electrostatic chuck 15 (step S107).

Figure 5:
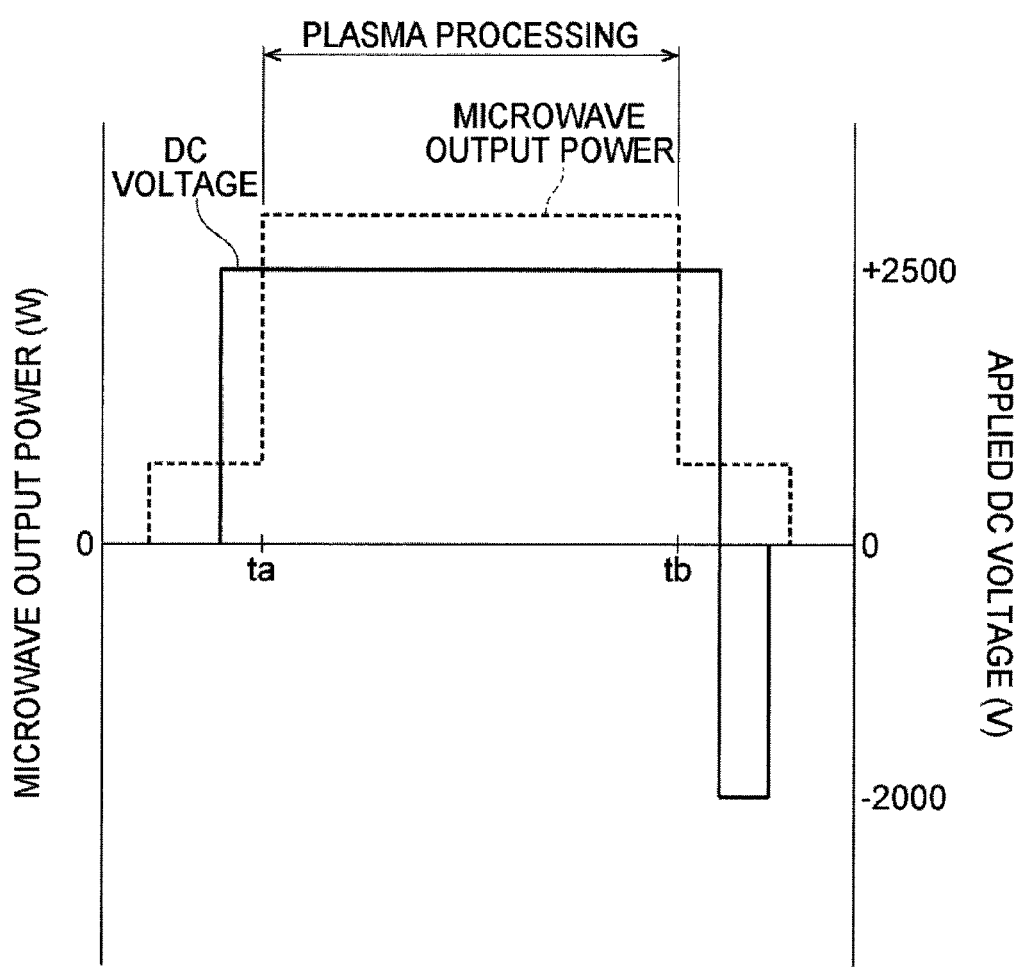
FIG. 5 is a sequence diagram illustrating operating timings of a high-frequency power supply and a DC power supply.

Here, detailed descriptions will be made on the control of the microwave generator 16 and the control of the DC power supply 64 from the plasma generation process to the attraction release process. FIG. 5 is a sequence diagram illustrating the operating timings of the high-frequency power supply 16 and the DC power supply 64. In FIG. 5, the horizontal axis represents time, and the vertical axis represents an output power (W) of the microwave outputted from the microwave generator 16 (indicated by a solid line) and an applied DC voltage value (V) to the electrostatic chuck 15 by the DC power supply 64 (indicated by a dotted line). Meanwhile, the applied DC voltage value as illustrated in FIG. 5 is illustrative only, but not limited thereto.

As indicated by the dotted line in FIG. 5, the control unit 100 first controls the microwave generator 16 to output a microwave, thereby generating plasma. Then, as indicated by the solid line in FIG. 5, the control unit 100 controls the DC power supply 64 to apply the DC voltage to the electrode 15d of the electrostatic chuck 15. Meanwhile, since the substrate to be processed W is not attracted to the electrostatic chuck 15 before starting the application of the DC voltage to the electrode 15d of the electrostatic chuck 15, the temperature control is not sufficiently performed. Therefore, the output power of the microwave is preferably set to be a low power, as compared with a case of performing the processing, so that the temperature of the substrate to be processed W is not increased by the action of the plasma.

Then, the plasma processing is performed during the time ta to tb when the output power of the microwave becomes an output power value for the plasma processing. After the plasma processing is completed, even when the substrate to be processed W is removed from the electrostatic chuck 15, as illustrated in FIG. 5, the control unit 100 first controls the microwave generator 16 to reduce the output power of the microwave to a lower power value (not 0 W) as compared with a case of performing the processing. Then, the control unit 100 controls the DC power supply 64 to stop the application of the DC voltage to the electrode 15d of the electrostatic chuck 15. Thereafter, the control unit 100 stops the output of the microwave from the microwave generator 16 to turn off the plasma. Meanwhile, when the control unit 100 stops the application of the DC voltage to the electrode 15d of the electrostatic chuck 15, the control unit 100 first applies voltage (e.g., about −2,000 V) having a reverse polarity as compared to the voltage applied during the attraction of the substrate to be processed W to the electrode 15d of the electrostatic chuck 15 to remove the charge of the electrostatic chuck 15, thereby making it easy to take off the substrate to be processed W. The application of the voltage with reverse polarity is performed as necessary.

Meanwhile, the sequence diagram as illustrated in FIG. 5 is also applicable to the control of RF power for plasma excitation in a parallel flat plate electrode type plasma processing apparatus.

Referring back to FIG. 3, after the attraction and holding of the substrate to be processed W is released by the electrostatic chuck 15, the control unit 100 performs a carry-out process (step S108) to carry the substrate to be processed W out of the processing container 12. Specifically, the control unit 100 controls an arm, which performs the carry-out of the substrate to be processed W, to carry the substrate to be processed W out of the processing container 12 through the gate 12g.

After the carry-out process, the aforementioned processing is repeated by returning to the cleaning process (step S101).

As described above, before the carry-in of the substrate to be processed W, the control unit 100 applies voltage to the focus ring 17 such that the potential difference between the focus ring 17 and the substrate to be processed W which is carried in is reduced. Accordingly, when the substrate to be processed W is carried in, the microparticles adhering to the focus ring 17 are suppressed from being moved to the top surface (a surface to be processed) of the substrate to be processed W by the potential difference between the focus ring 17 and the substrate to be processed W and suppressed from adhering to the substrate to be processed W.

Here, the inventors of the present disclosure have found out that the microparticles tend to gather mainly in the vicinity of the edge of the substrate to be processed W in a case where there are a lot of microparticles adhering to the substrate to be processed W, when the plasma processing is performed on the substrate to be processed W without performing the aforementioned voltage application process (step S102) (that is, a conventional plasma processing) and the substrate to be processed W is observed after the conventional plasma processing. This may be considered that, when the substrate to be processed W is placed on the electrostatic chuck 15, the microparticles adhering to the focus ring 17, which is disposed to surround the edge of the substrate to be processed W, are moved from the focus ring 17 to a region in the vicinity of the edge of the substrate to be processed W and adhere thereto. That is, by reducing the microparticles which are moved from the focus ring 17 to the substrate to be processed W and adhere to the substrate to be processed W, it may be said that the microparticles adhering to the substrate to be processed W may be effectively reduced.

Therefore, in the present exemplary embodiment, since the potential difference between the substrate to be processed W and the focus ring 17 is reduced by performing the voltage application process as described above, the microparticles which are moved from the focus ring 17 to the substrate to be processed W and adhere thereto may be reduced, and the microparticles adhering to the substrate to be processed W may be effectively reduced.

Hereinafter, descriptions will be made on an exemplary embodiment in which the plasma processing is performed on the substrate to be processed W using the aforementioned plasma processing apparatus 10, and then, microparticles adhering to the substrate to be processed W are counted. Meanwhile, $SiO_2$ was used as a material of the focus ring 17, and $Al_2O_3$ was used as a material of the electrostatic chuck. Further, as for the sidewall 12a, a member in which a coating of yttria ($Y_2O_3$) is performed on a surface of a base material forming the sidewall 12a was used. Further, in the cleaning process, the WLDC was performed using a mixed gas of $SF_6$ and $O_2$.

Further, among a plurality of sheets of the substrates to be processed W sequentially subjected to the plasma processing, one sheet of the substrate to be processed W is taken out every predetermined number of sheets (here, as an example, every 25 sheets), and the taken substrate to be processed W was used as a subject for counting microparticles. Meanwhile, the substrate to be processed W serving as the subject for counting microparticles may also be a monitor substrate for counting the microparticles.

Figure 6:
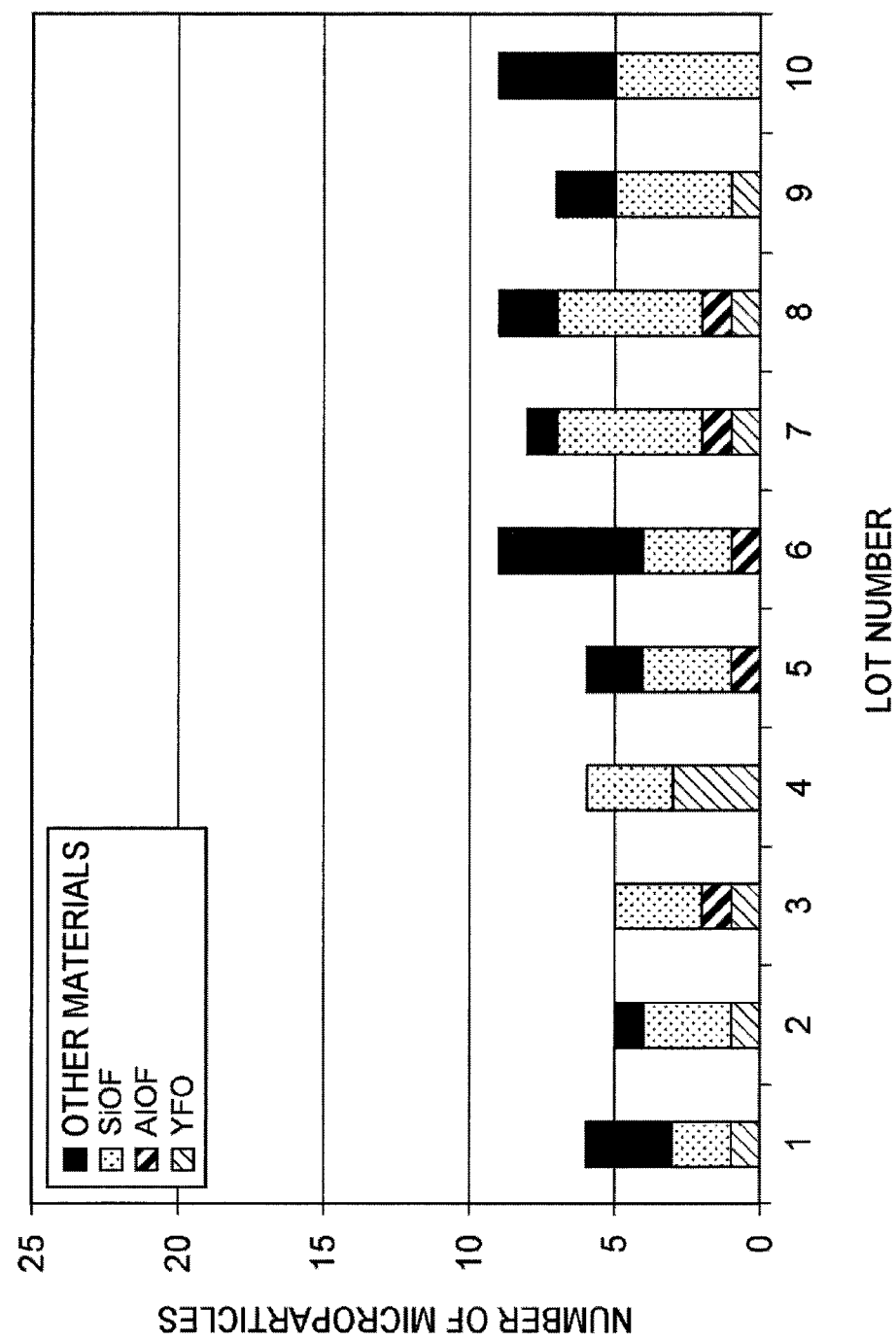
FIG. 6 is a view illustrating a result of counting microparticles in an exemplary embodiment.
Figure 7:
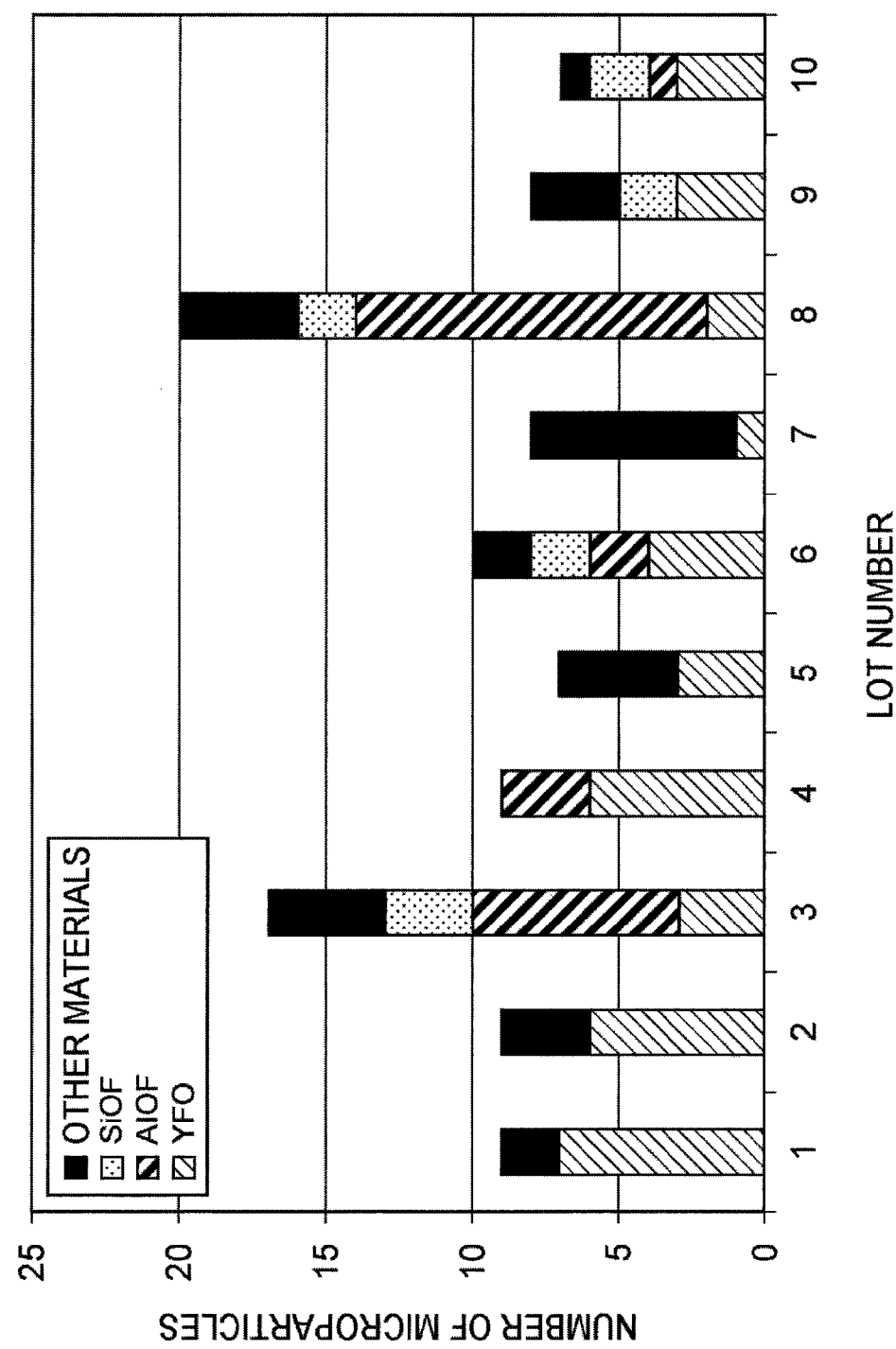
FIG. 7 is a view illustrating a result of counting microparticles in a comparative embodiment.

The microparticles adhering to the substrate to be processed W serving as the counting subject was classified into four kinds, that is, YFO, AlOF, SiOF, and others, and counted, respectively. FIG. 6 is a view illustrating a result of counting microparticles in the exemplary embodiment. In FIG. 6, a lot number is a number assigned to the substrate to be processed W serving as a counting subject. Further, as a comparative embodiment, microparticles adhering to the substrate to be processed W serving as a counting subject were counted without performing the voltage application process. FIG. 7 is a view illustrating a result of counting microparticles in the comparative embodiment. Meanwhile, in the comparative embodiment, the same processes were performed as in the exemplary embodiment, except that the voltage application process was not performed.

As illustrated in FIGS. 6 and 7, in the exemplary embodiment in which the voltage application process was performed (FIG. 6), the number of microparticles adhering to the substrate to be processed W serving as a counting subject was reduced, as compared with the comparative embodiment in which the voltage application process was not performed (FIG. 7).

Here, among the counted microparticles, YFO, ALOF, and SiOF may be generated when the sidewall 12a, the electrostatic chuck 15 and the focus ring 17 are damaged by the processing gas used in the WLDC. Further, in the comparative embodiment, more ALOF is detected as compared with the exemplary embodiment. This is considered that ALOF in a shape of microparticles generated when the electrostatic chuck 15 is damaged by the WLDC is deposited on the focus ring 17, and the ALOF adheres to the substrate to be processed W by the potential difference between the substrate to be processed W and the focus ring 17. In contrast, in the exemplary embodiment, it is considered that, since the potential difference between the substrate to be processed W and the focus ring 17 is reduced by performing the voltage application process, the ALOF in a shape of microparticles moved from the focus ring 17 to the substrate to be processed W and adhering to the substrate to be processed W is reduced.

Further, as illustrated in FIG. 7, in the comparative embodiment, in the substrates to be processed W of lot numbers 3 and 8, a lot of ALOF in a shape of microparticles is detected. This is considered that the ALOF accumulated on a step portion of the focus ring 17 is moved together to the substrate to be processed W by the potential difference between the substrate to be processed W and the focus ring 17 when the substrate to be processed W is carried into the processing container 12. Therefore, it is not desirable that large amounts of microparticles adhere to the substrate to be processed W. In contrast, in the exemplary embodiment as illustrated in FIG. 6, since the potential difference between the substrate to be processed W and the focus ring 17 is reduced by performing the voltage application process, the ALOF in a shape of microparticles, which is moved together from the focus ring 17 to the substrate to be processed W, is suppressed.

Next, descriptions will be made on the voltage applied to the electrostatic chuck 15 in order to reduce the potential difference between the substrate to be processed W and the focus ring 17. FIG. 8 is a view illustrating the number of microparticles adhering to the substrate to be processed W in a case of changing the voltage applied to the electrostatic chuck 15, and the deviation of the distribution of the microparticles on the substrate to be processed W. Here, a substrate made of bare Si was used as the substrate to be processed W. Further, in order to show the deviation of the distribution of the microparticles on the substrate to be processed W, an index showing how much microparticles are concentrated and adhere to a region in the vicinity of the edge of the substrate to be processed W was used. The index may be determined by any known statistical method using P-test. FIG. 8 illustrates the index in which the bar graph represents the number of microparticles adhering to the substrate to be processed W, and the line graph represents the deviation of the distribution of the microparticles on the substrate to be processed. The voltage values applied to the electrostatic chuck 15 were set to five kinds, that is, −2,500 V, −1,000 V, −500 V, no voltage applied, and 500 V, and each voltage was applied to the electrostatic chuck 15 for 1 second.

As illustrated in FIG. 8, in cases where −500 V and −1,000 V were applied to the electrostatic chuck 15, the number of microparticles adhering to the substrate to be processed W and the number of microparticles adhering to a region in the vicinity of the edge of the substrate to be processed W were reduced, as compared with a case where no voltage was applied to the electrostatic chuck 15. That is, it is considered that the potential difference between the focus ring 17 and the substrate to be processed W is reduced by applying voltage ranging less than 0 V to about −1,000 V to the electrostatic chuck 15, and hence, the number of microparticles adhering to the substrate to be processed W is reduced. Further, particularly, when voltage of −500 V was applied to the electrostatic chuck 15, the number of microparticles adhering to the substrate to be processed W was reduced most. That is, it is considered that the potential difference between the focus ring 17 and the substrate to be processed W was reduced most.

In the present exemplary embodiment as describe above, the potential difference between the focus ring 17 and the substrate to be processed W is reduced by applying voltage to the electrostatic chuck 15. Accordingly, when the substrate to be processed W is carried into the processing container 12 after the process of applying voltage to the electrostatic chuck 15, the adherence of microparticles to the substrate to be processed W due to the movement of the microparticles adhering to the focus ring 17 towards the substrate to be processed W by the potential difference between the focus ring 17 and the substrate to be processed W, is reduced.

Further, before the process of applying voltage to the electrostatic chuck 15, a process of cleaning the inside of the processing container 12 in a state where the substrate to be processed W is not accommodated in the processing container 12 may be included. Accordingly, the adherence of microparticles remaining after the cleaning to the substrate to be processed W may be reduced.

Accordingly, when the process of applying voltage to the electrostatic chuck 15 is performed before a new substrate to be processed W is carried into the processing container 12, the adherence of microparticles to the substrate to be processed W may be more ensured to be reduced.

Further, the microparticles in the processing container 12 are usually positively charged. Therefore, when a negative voltage is applied to the electrostatic chuck 15 and the absolute value of the voltage is set to a value less than the absolute value of the voltage applied to the electrostatic chuck 15 when the electrostatic attraction is performed, the adherence of microparticles to the substrate to be processed W may be further reduced.

From the foregoing, various embodiments have been described, but various modifications may be made without being limited to the aforementioned embodiments. For example, the focus ring may be made of silicon (Si) depending on the kind of the processing gas, instead of silicon oxide.

Description of Symbol
 10: plasma processing apparatus
 12: processing container
 17: focus ring
 15: electrostatic chuck
 38c, 38e: gas source (gas supply unit)
 64: DC power supply
 100: control unit
 S: processing space
 W: substrate to be processed

What is claimed is:

1. A method of controlling adherence of microparticles to a substrate to be processed by using a processing apparatus which comprises:
 a processing container;
 an electrostatic chuck provided on a top surface of a table serving as an electrode in the processing container and configured to electrostatically attract the substrate;
 a focus ring provided radially outside the electrostatic chuck to annularly surround a periphery of the substrate and a periphery of the electrostatic chuck; and
 a direct current (DC) power supply configured to apply DC voltage to the electrostatic chuck,
 the method comprising:
 performing a processing step that includes supplying a processing gas into the processing container and generating plasma from the processing gas in the processing container, wherein the plasma comprises one or more ions and reacts with the focus ring to generate microparticles, and the microparticles are adhered to the focus ring;
 after completion of the processing step, supplying a purge gas into the processing container to replace the processing gas such that the plasma generated from the processing gas is extinguished;
 before the substrate is carried into the processing container and while the purge gas is supplied into the processing container, a first applying of a predetermined voltage to the electrostatic chuck in a state where the focus ring is positively or negatively charged by one or more ions remaining in the processing container from the processing step and the predetermined voltage applied to the electrostatic chuck in the first applying having a polarity opposite to that of the focus ring charged by the one or more ions; and after the first applying of the predetermined voltage to the electrostatic chuck, carrying the substrate into the processing container; and after the carrying the substrate into the processing container, a second applying of a predetermined voltage to the electrostatic chuck to attract the substrate electrostatically to the electrostatic chuck, wherein the substrate is either charged or not charged during the carrying the substrate into the processing container, and wherein the first applying of the predetermined voltage to the electrostatic chuck controls a potential of the electrostatic chuck before the substrate is carried into the processing container, thereby reducing a potential difference between the focus ring and the substrate, and suppressing the microparticles adhered on the focus ring from being moved to the substrate.

2. The method of claim 1, wherein the processing step includes cleaning an inside of the processing container before the first applying the predetermined voltage to the electrostatic chuck.

3. The method of claim 1, wherein the first applying of the predetermined voltage to the electrostatic chuck is performed every time before the substrate is carried into the processing container.

4. The method of claim 1, wherein when the focus ring is positively charged before the substrate is carried into the processing container, a predetermined negative voltage is applied to the electrostatic chuck in the first applying, and wherein the predetermined negative voltage applied to the electrostatic chuck in the first applying has an absolute value less than an absolute value of the predetermined voltage applied to the electrostatic chuck in the second applying to the electrostatic chuck when the electrostatic chuck electrostatically attracts the substrate to be processed.

5. The method of claim 1, wherein the purge gas comprises nitrogen.

6. The method of claim 1, wherein when the focus ring is positively charged, the predetermined voltage applied to the electrostatic chuck in the first applying ranges from −1,000 V to less than 0 V.

7. The method of claim 1, wherein the predetermined voltage applied to the electrostatic chuck in the second applying includes a positive DC voltage.

8. The method of claim 2, wherein the cleaning the inside of the processing container includes a wafer less dry cleaning (WLDC).

* * * * *